United States Patent
Kang

(10) Patent No.: US 7,474,782 B2
(45) Date of Patent: Jan. 6, 2009

(54) APPARATUS AND METHOD FOR PROCESSING HOLOGRAPHIC DATA REPRODUCED FROM A HOLOGRAPHIC MEDIUM

(75) Inventor: Byung-Bok Kang, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 676 days.

(21) Appl. No.: 10/872,422

(22) Filed: Jun. 22, 2004

(65) Prior Publication Data

US 2005/0105152 A1 May 19, 2005

(30) Foreign Application Priority Data

Nov. 15, 2003 (KR) ............. 10-2003-0080843

(51) Int. Cl.
*G06K 9/00* (2006.01)
(52) U.S. Cl. .............. 382/154; 382/298; 235/494
(58) Field of Classification Search ............. 382/154
See application file for complete search history.

(56) References Cited

U.S. PATENT DOCUMENTS

| 5,335,296 A * | 8/1994 | Larkin et al. ............. 382/298 |
| 5,511,058 A | 4/1996 | Visel et al. ............. 369/103 |
| 5,539,534 A | 7/1996 | Hino et al. ............. 358/452 |
| 5,694,488 A | 12/1997 | Hartmann ............. 382/210 |
| 5,917,798 A | 6/1999 | Horimai et al. ............. 369/103 |
| 6,414,296 B1 | 7/2002 | Edwards ............. 250/208.1 |
| 6,889,907 B2 * | 5/2005 | Roh ............. 235/494 |
| 6,895,114 B2 * | 5/2005 | Hwang ............. 382/173 |
| 2002/0015376 A1 | 2/2002 | Liu et al. ............. 369/103 |
| 2003/0228071 A1 | 12/2003 | Gimenez et al. ............. 382/298 |

FOREIGN PATENT DOCUMENTS

| EP | 0855717 | 7/1998 |
| EP | 1059574 | 12/2000 |
| EP | 1460622 | 9/2004 |

* cited by examiner

*Primary Examiner*—Samir A Ahmed
*Assistant Examiner*—Aklilu k Woldemariam
(74) *Attorney, Agent, or Firm*—Bacon & Thomas, PLLC

(57) ABSTRACT

In an apparatus for processing holographic data reproduced from a holographic medium, a data arranging unit arranges input data in a form of M1×M2 data pixels on a page basis to thereby generate arranged data. Then, a holographic data detector outputs a page image including a detected data image, each data pixel of the arranged data corresponding to P1×P2 image pixels of the detected data image. Thereafter, a resized pixel detector finds a resized vertical length V and a resized horizontal length H of the detected data image. Finally, a sampling unit extracts image pixels at different intervals depending on whether the horizontal length and/or the vertical length of the detected data image is increased or decreased.

8 Claims, 4 Drawing Sheets

APPARATUS AND METHOD FOR PROCESSING HOLOGRAPHIC DATA REPRODUCED FROM A HOLOGRAPHIC MEDIUM

FIELD OF THE INVENTION

The present invention relates to a holographic data reconstruction system; and, more particularly, to an apparatus and a method for processing holographic data reproduced from a holographic medium, which correct an image distortion in a reconstruction mode.

BACKGROUND OF THE INVENTION

As is well known, demands for a volume holographic digital data storage system that can store a large amount of data, such as data for a motion picture film, have been increasing and various types of holographic digital data storage system have been recently developed for realizing high density optical storage capabilities.

The volume holographic digital data storage system allows a signal beam having information therein to interfere with a reference beam to generate an interference pattern therebetween and, then, controls the interference pattern to be stored in a storage medium made of an optical refractive crystal. The optical refractive crystal is a material which may react differently on different amplitudes and phases of the interference pattern.

Various holograms can be recorded in the storage medium by changing an angle of incidence of the reference beam (angular multiplexing) and/or by moving the storage medium to change a recording area (shift multiplexing), so that a great number of holograms of binary data can be stored in the storage medium on a page-by-page basis.

An example of the conventional apparatus for storing and reconstructing holographic data is described in U.S. Pat. No. 6,490,061 B1.

FIG. 1 depicts a block diagram of a conventional apparatus for storing and reconstructing holographic data, which includes a light source 10, a beam splitter 20, two reflection mirrors 30 and 40, a shutter 45, a spatial light modulator (SLM) 50, a storage medium 60, a CCD 70, a data arranging unit 80 and a signal processing unit 90.

The light source 10 generates a laser beam. The beam splitter 20 splits the laser beam into a reference beam and a signal beam and transfers the separated reference and signal beams along two different optical paths, wherein the reference beam and the signal beam correspond to a transmitted beam and a reflected beam, respectively.

The reference beam is reflected at the reflection mirror 30 so that the reflected reference beam is transferred to the storage medium 60. The signal beam, on the other hand, is reflected at the reflection mirror 40 so that the reflected signal beam is transferred to the SLM 50. In a recording mode, the shutter 45 stays open to allow the signal beam to be transferred to the SLM 50.

In the meantime, binary input data to be stored are arranged in a data arrangement of M1 bits in a row and M2 bits in a column on a page basis at the data arranging unit 80, wherein M1 and M2 being positive integers, respectively. Hereinafter, the arranged binary input data consisting of M1×M2 data pixels are referred to as arranged data. The SLM 50 modulates the reflected signal beam with the arranged data transferred from the data arranging unit 80 to provide a modulated signal beam for each page.

The modulated signal beam is transferred to the storage medium 60. The reflection mirror 30 functions to change the reflection angle of the reflected reference beam by a small amount for data storage on a different page.

The interference pattern of the modulated signal beam interfering with the reference beam is stored in the storage medium 60. In this case, the interference pattern stored in the storage medium 60 may be consisted of M1×M2 data pixels and, hereinafter, it is referred to as a stored data image. Typically, the stored data image has "light" and "dark" images, the "light" images representing a logic value "1" and the "dark" images representing a logic value "0".

During a reconstruction mode, the shutter 45 turns to be closed so that a signal beam cannot be introduced to the storage medium 60. Accordingly, only a reference beam is irradiated onto the storage medium 60.

When a reference beam is irradiated onto the storage medium 60 in order to reconstruct the data written thereon, the reference beam is diffracted by the interference pattern stored in the storage medium 60 so that a reproduced data image for each page may be restored. In this case, the reproduced data image may be consisted of M1×M2 data pixels and it is correspondent to the stored data image.

The reference beam used to reproduce the data written in the storage medium 60 should be irradiated thereon at the same incident angle as that of the reference beam used to record the data.

The reproduced data image is directed toward the CCD 70 to thereby be detected by the CCD 70 and transferred to the signal processing unit 90. The CCD 70 outputs a page image having a size of N1×N2 image pixels, with N1 and N2 being positive integers, respectively. In this case, the page image includes a detected data image corresponding to the reproduced data image.

If each data pixel of the reproduced data image corresponds to P1×P2 image pixels of the page image, the detected data image may be represented by (M1*P1)×(M2*P2) image pixels within the page image, wherein P1 and P2 are positive integers, respectively.

Therefore, image pixels should be sampled from the detected data image at the signal processing unit 90, so that a processed data image is consisted of M1×M2 data pixels that are equivalent to the size of the arranged data.

In a holographic data storing/restoring apparatus, however, the light intensity representing a logic value "1" or "0" within the page image is high at a point in the central region of the P1×P2 image pixels and decreases rather rapidly as the detecting point moves away from the central region toward the peripheral region thereof.

In case that an image pixel placed at the peripheral region of the P1×P2 image pixels is sampled from the detected data image, it is hard to classify the image pixel into one of two binary values, i.e., "0" or "1", accurately. Accordingly, it is preferred to extract an image pixel placed at the central region of the P1×P2 image pixels in order to classify "dark" images and "light" images into "0" and "1" accurately. In detail, each image pixel at the central region of the P1×P2 image pixels is to be sampled at intervals of P1 and P2 image pixels in a vertical and a horizontal direction, respectively.

However, due to imperfections in a holographic data storing/restoring apparatus, there may be distortions or offsets between the arranged data and the detected data image. As a result, the detected data image can be decreased or increased along a vertical and/or a horizontal direction, so that the detected data image can be consisted of (M1*P1+V)× (M2*P2+H) image pixels, with V and H being integers, respectively. Here, V and H are the number of image pixels representing a resized vertical length and a resized horizontal length of the detected data image, respectively.

In this case, if a conventional sampling method such as above is carried out on the detected data image, there may be image pixels sampled at the peripheral region of the P1×P2 image pixels. In other words, if the detected data image is not consisted of (M1*P1)×(M2*P2) image pixels, the conventional sampling method may have errors.

For this reason, it would be desirable to provide an apparatus for processing holographic data reproduced from a storage medium 60, which is capable of reducing or correcting these errors.

SUMMARY OF THE INVENTION

It is, therefore, an object of the present invention to provide an apparatus and a method for processing holographic data reproduced from a holographic medium, which correct an image distortion in a reconstruction mode.

In accordance with one aspect of the present invention, there is provided an apparatus for processing holographic data reproduced from a holographic medium, including a data arranging unit for arranging input data in a form of M1×M2 data pixels on a page basis to thereby generate arranged data, with M1 and M2 being positive integers, respectively; a holographic data detector for outputting a page image including a detected data image, each data pixel of the arranged data corresponding to P1×P2 image pixels of the detected data image and P1 and P2 being positive integers, respectively; a resized pixel detector for finding a resized vertical length V and a resized horizontal length H of the detected data image, V and H being integers, respectively; and a sampling unit for (a) partitioning the detected data image into equal (|V|+1)×(|H|+1) parts; (b) in case that both a previous and a current sampled image pixel belong to an identical part among the partitioned (|V|+1)×(|H|+1) parts, extracting image pixels at intervals of P1 and P2 image pixels in a vertical and a horizontal direction, respectively; and (c) in case that a previous and a current sampled image pixel are positioned in different parts from each other, (c1) sampling image pixels at intervals of (P1+1) image pixels in a vertical direction if the vertical length of the detected data image is increased, (c2) sampling image pixels at intervals of (P2+1) image pixels in a horizontal direction if the horizontal length thereof is increased, (c3) sampling image pixels at intervals of (P1−1) image pixels in a vertical direction if the vertical length thereof is decreased, and (c4) sampling image pixels at intervals of (P2−1) image pixels in a horizontal direction if the horizontal length thereof is decreased.

In accordance with another aspect of the present invention, there is provided a method for processing holographic data reproduced from a holographic medium, including the steps of (a) arranging input data in a form of M1×M2 data pixels on a page basis to thereby generate arranged data, with M1 and M2 being positive integers, respectively; (b) outputting a page image including a detected data image, each data pixel of the arranged data corresponding to P1×P2 image pixels of the detected data image and P1 and P2 being positive integers, respectively; (c) finding a resized vertical length V and a resized horizontal length H of the detected data image, V and H being integers, respectively; and (d) (d1) partitioning the detected data image into equal (|V|+1)×(|H|+1) parts; (d2) in case that both a previous and a current sampled image pixel belong to an identical part among the partitioned (|V|+1)× (|H|+1) parts, extracting image pixels at intervals of P1 and P2 image pixels in a vertical and a horizontal direction, respectively; and (d3) in case that a previous and a current sampled image pixel are positioned in different parts from each other, (d31) sampling image pixels at intervals of (P1+1) image pixels in a vertical direction if the vertical length of the detected data image is increased, (d32) sampling image pixels at intervals of (P2+1) image pixels in a horizontal direction if the horizontal length thereof is increased, (d33) sampling image pixels at intervals of (P1−1) image pixels in a vertical direction if the vertical length thereof is decreased, and (d34) sampling image pixels at intervals of (P2−1) image pixels in a horizontal direction if the horizontal length thereof is decreased.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment of the present invention will now be described hereinafter with reference to the drawings.

Figure 1:
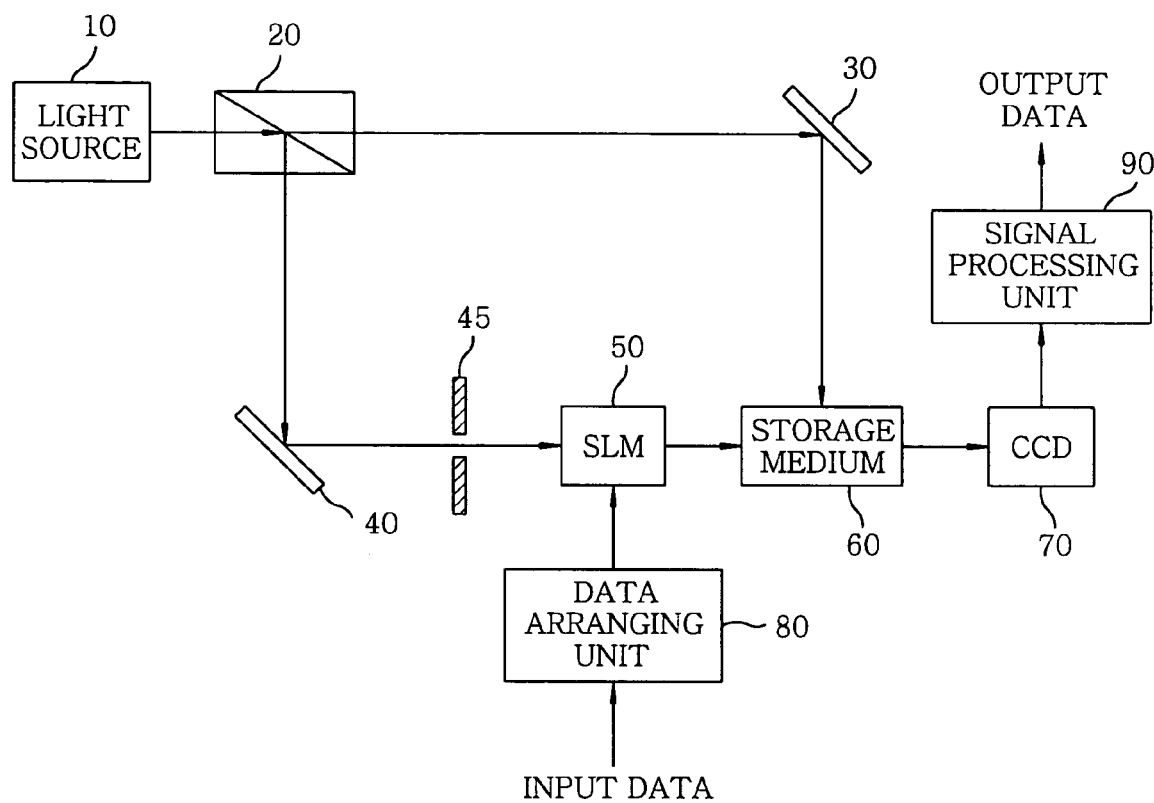
FIG. 1 illustrates a schematic view of a conventional apparatus for storing and reconstructing holographic data.
Figure 2:
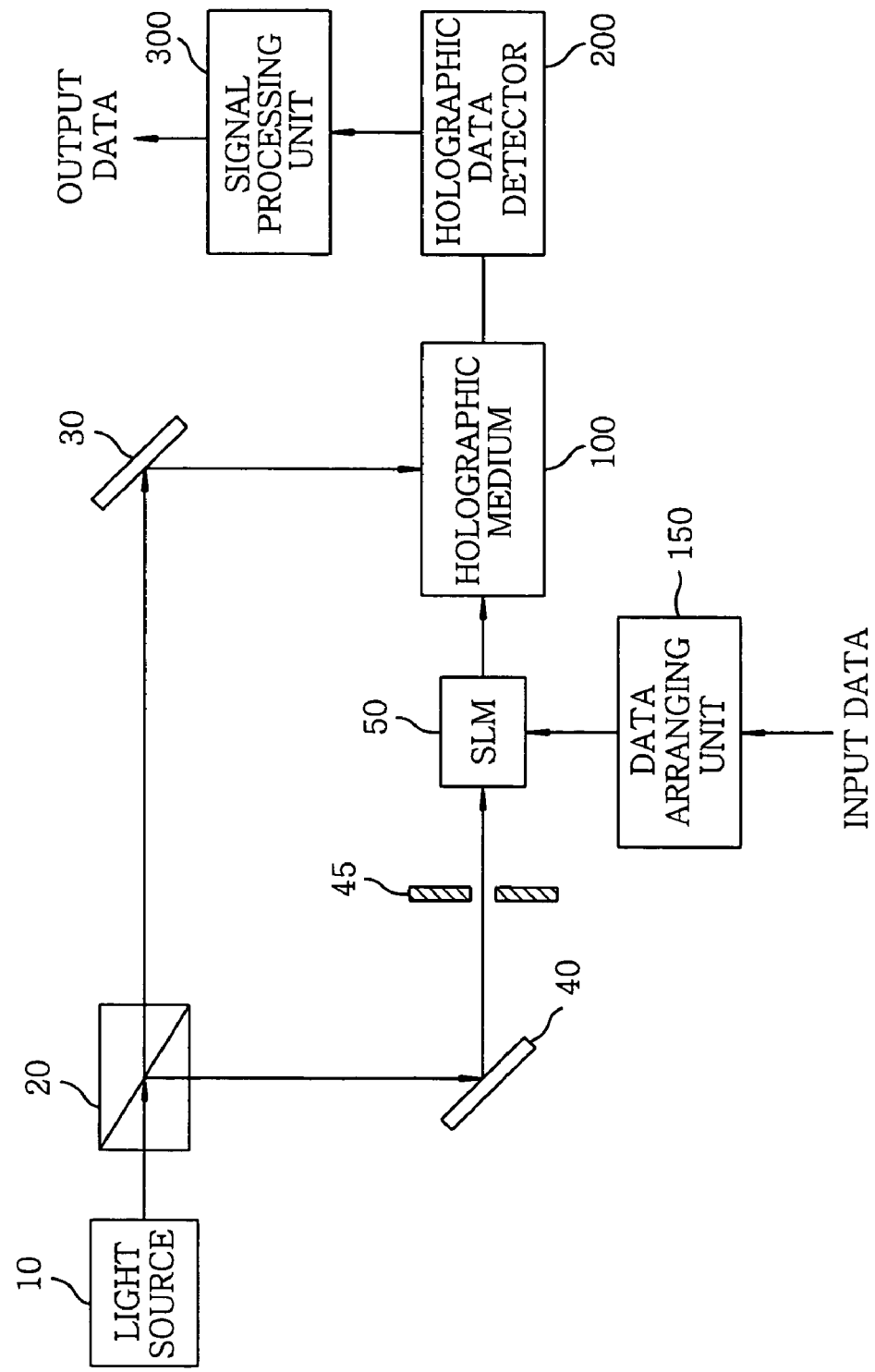
FIG. 2 is a schematic view of an apparatus for storing and reconstructing holographic data in accordance with a preferred embodiment of the present invention.

FIG. 2 shows a schematic view of an apparatus for storing and reconstructing holographic data, wherein like reference numerals are given for like parts as those of the conventional apparatus shown in FIG. 1 and therefore descriptions on the operations thereof will not be repeated.

First, binary input data to be stored are arranged in a form of M1×M2 data pixels on a page basis in a data arranging unit 150, with M1 and M2 being positive integers, respectively. In this case, brim data of a rectangular shape are also arranged to surround the arranged data of M1×M2 data pixels. Hereinafter, the arranged data with the arranged brim are referred to as an arranged pattern and the use of the arranged brim will be described later.

An SLM 50 modulates a signal beam with the arranged pattern for each page to provide a modulated signal beam. The modulated signal beam is transferred to the holographic medium 100. An interference pattern of the modulated signal beam interfering with a reference beam is stored in the holographic medium 100.

Figure 3A:
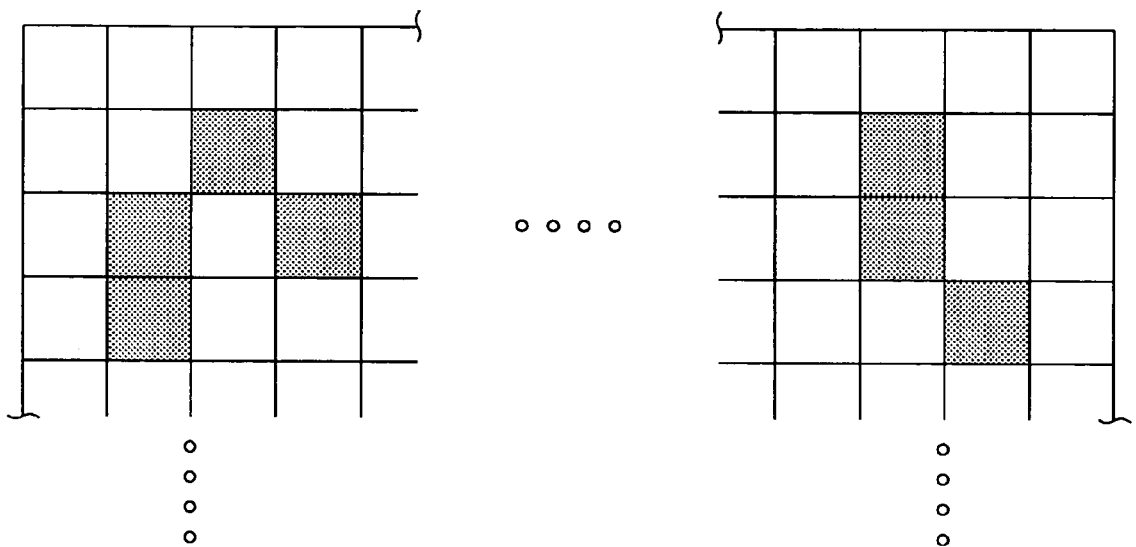
FIG. 3A depicts an upper left and an upper right corner of an exemplary interference pattern.

FIG. 3A shows an upper left and an upper right corner of an exemplary interference pattern. In FIG. 3A, the interference pattern includes a stored data image corresponding to the arranged data and a stored brim corresponding to the arranged brim. In detail, the stored brim of a rectangular shape is represented by, e.g., the "light" images representing a logic value "1" and surrounds the stored data image. Generally, a stored brim may have a thickness of T data pixels and may be placed D data pixels apart from a stored data image corresponding thereto. In FIG. 3A, T and D are equivalent to 1 and 0, respectively.

In a reconstruction mode, if a reference beam is irradiated onto the holographic medium 100, a reproduced pattern corresponding to the interference pattern may be obtained. Then, the reproduced pattern is directed toward the holographic data detector 200, e.g., a CCD (charge coupled device).

The reproduced pattern may include a reproduced data image and a reproduced brim surrounding the reproduced data image. Here, the reproduced data image and the reproduced brim correspond to the stored data image and the stored brim, respectively.

The holographic data detector 200 generates a page image having a size of N1×N2 image pixels and the page image includes a detected data image and a detected brim surrounding the detected data image, wherein N1 and N2 are positive integers, respectively. The detected data image and the detected brim correspond to the reproduced data image and the reproduced brim, respectively.

Each data pixel of the reproduced pattern corresponds to P1×P2 image pixels of the page image, wherein P1 and P2 are positive integers, respectively. Accordingly, if no distortions occurred, the arranged data of M1×M2 data pixels may be represented by the detected data image of (M1*P1)×(M2*P2) image pixels at the holographic data detector 200, wherein M1*P1 image pixels and M2*P2 image pixels are an ideal vertical length and an ideal horizontal length of the detected data image, respectively.

In this case, the detected brim may be consisted of a top and a bottom side, each of which having a thickness of T*P1 image pixels, and a left and a right side, each of which having a thickness of T*P2 image pixels. Further, the detected brim may be placed D*P1 and D*P2 image pixels apart from the top/bottom side and the left/right side of the detected data image, respectively.

The signal processing unit 300 generates a processed data image of M1×M2 data pixels, which are equivalent to the size of the arranged data, by performing a sampling from the page image of N1×N2 image pixels. Then, the signal processing unit 300 decodes the processed data image, thereby generating binary values.

There, however, may be distortions or offsets between the arranged data and the detected data image so that the detected data image will not be consisted of (M1*P1)×(M2*P2) image pixels. That is, the detected data image can be decreased or increased along a vertical and/or a horizontal direction, so that the detected data image may be consisted of (M1*P1+V)×(M2*P2+H) image pixels, with V and H being integers, respectively. Here, V and H are the number of image pixels representing a resized vertical length and a resized horizontal length of the detected data image, respectively.

Figure 3B:
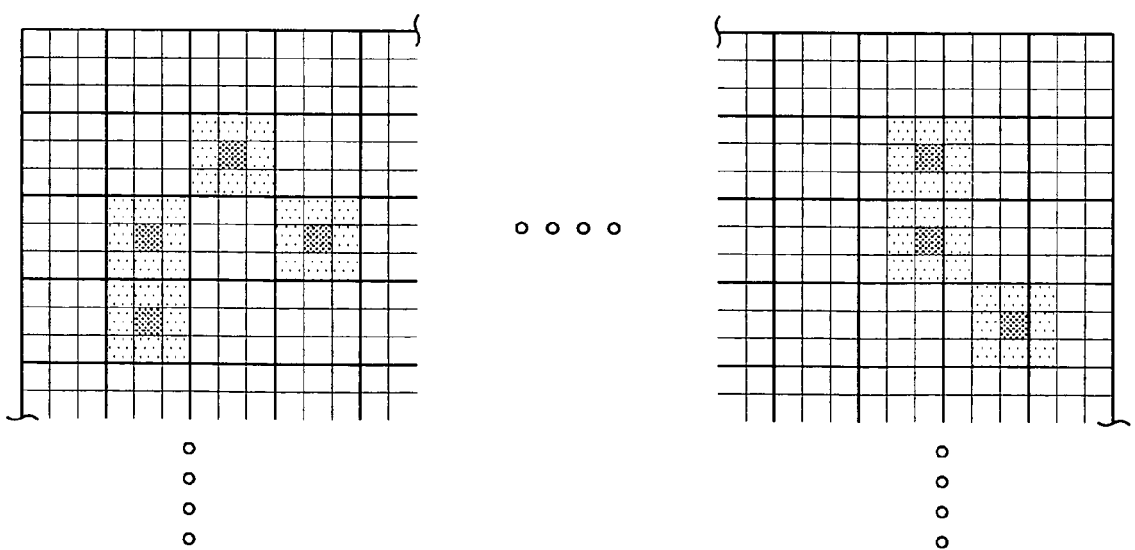
FIG. 3B provides an upper left and an upper right corner of an exemplary detected pattern corresponding to the interference pattern shown in FIG. 3A.

FIG. 3B is an upper left and an upper right corner of an exemplary detected pattern corresponding to the interference pattern shown in FIG. 3A. In FIG. 3B, each data pixel of the stored data image is represented by 3×3 image pixels of the detected data image. In this case, since the horizontal length of the detected data image is increased by one image pixel, the detected data image is consisted of (M1*P1)×(M2*P2+1) image pixels.

The detected brim corresponding to the arranged brim may be used in finding a size of the detected data image. It will be understood that another methods employing, e.g., a specific mark or the like, other than the detected brim can be used to find the size of the detected data image.

Figure 4:
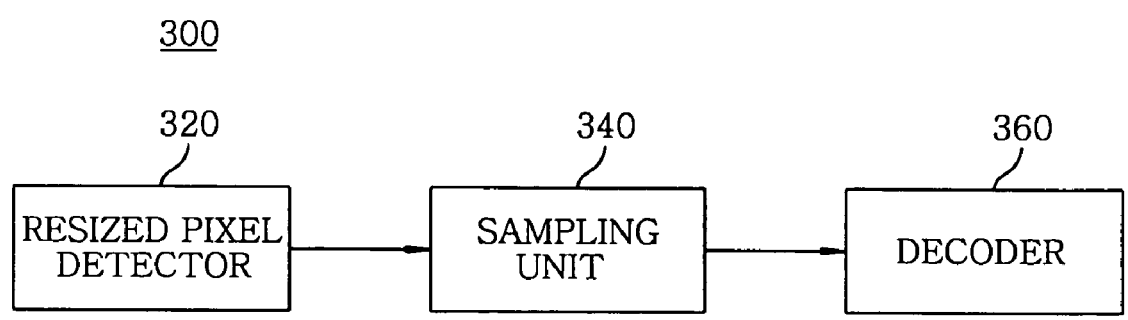
FIG. 4 shows a detailed block diagram of a signal processing unit in accordance with a preferred embodiment of the present invention.

In the following, the signal processing unit 300 in accordance with the preferred embodiment of the present invention is described in more detail with reference to FIG. 4. The signal processing unit 300 may include a resized pixel detector 320, a sampling unit 340 and a decoder 360.

First, the resized pixel detector 320 finds the number of image pixels V and H representing a resized vertical length and a resized horizontal length of the detected data image, respectively.

Specifically, the resized pixel detector 320 searches the detected brim surrounding the detected data image from the page image of N1×N2 image pixels. For example, it is assumed that all image pixels placed on the detected brim have "light" images representing a logic value "1" as shown in FIG. 3B. Then, the resized pixel detector 320 computes a sum of light intensity values of all columns for each row and the computation such as above is repeated for all rows from the page image. In this case, each of T*P1 rows on the top or the bottom side of the detected brim may have a maximum value among the sums. Since the rows having a maximum value may be located on the top or the bottom side of the detected brim, the positions thereof will be detected. In a similar manner, the positions of the left side and the right side of the detected brim are found. Under practical conditions, since "dark" images affect "light" images adjacent thereto, a middle row among the T*P1 rows on the top or the bottom side of the detected brim or a middle row among the T*P2 columns on the left or the right side of the detected brim may have a maximum value.

Then, a vertical length of the detected data image is measured by using the positions of the top and the bottom side of the detected brim and D*P1 image pixels which is a distance between the detected data image and the top or the bottom side of the detected brim. Thereafter, the resized pixel detector 320 computes the resized vertical length V which is equivalent to a difference between the vertical length obtained such as above and the ideal vertical length of the detected data image, i.e., M1*P1 image pixels. In a similar manner, the resized horizontal length H can be calculated.

If no error occurred; that is, the number of image pixels H and V are both zero, respectively, the sampling unit 340 extracts each image pixel at the central region of the P1×P2 image pixels at intervals of P1 and P2 image pixels in a vertical and a horizontal direction, respectively, so that the processed data image of M1×M2 data pixels is obtained.

In the meanwhile, if the horizontal length and/or the vertical length of the detected data image is increased or decreased, the sampling unit 340 divides or partitions the detected data image into equal (|V|+1)×(|H|+1) parts.

The sampling unit 340 performs a sampling by way of extracting image pixels at intervals of P1 and P2 image pixels in a vertical and a horizontal direction, respectively, in case a previous sampled image pixel and a current sampled image pixel belong to an identical part among the partitioned (|V|+1)×(|H|+1) parts.

However, suppose that the sampling is performed on an area crossing over a border between two parts of the partitioned (|V|+1)×(|H|+1) parts; that is, the sampling is carried out in case that a previous sampled image pixel and a current sampled image pixel are positioned in different parts from each other. In this case, the sampling unit 340 extracts image pixels at intervals of (P1+1) image pixels in a vertical direction if the vertical length V of the detected image is increased and samples image pixels at intervals of (P2+1) image pixels in a horizontal direction if the horizontal length H thereof is increased. In a similar manner, the sampling unit 340 extracts image pixels at intervals of (P1−1) image pixels in a vertical direction if the vertical length V of the detected data image is decreased and samples image pixels at intervals of (P2−1) image pixels in a horizontal direction if the horizontal length H thereof is decreased.

From now on, suppose that M1 and M2 are both 240, P1 and P2 are both 3 and N1 and N2 are both 1024. In this case, the reproduced data image has 240×240 data pixels and each data pixel of the reproduced data image corresponds to 3×3 image pixels of the page image consisting of 1024×1024 image pixels. Further, for simplicity, the position of the image pixel at the most upper left corner of the detected data image is represented by (1, 1).

If no distortions occurred, the detected data image may be represented by 720×720 image pixels. In this case, the sampling unit 340 may generate the processed data image consisting of 240×240 data pixels by extracting image pixels placed at pixel positions (2, 2), (5, 2), (8, 2), . . . , (719, 2), (2, 5), (5, 5), . . . , (719, 719) at intervals of 3 image pixels in both a vertical and a horizontal direction from the detected data image.

If the size of the detected data image is 721×720 image pixels; that is, if the horizontal length thereof is increased by one image pixel as shown in FIG. 3B, the resized vertical length V and the resized horizontal length H are equivalent to 0 and 1, respectively. In this case, the sampling unit 340 partitions the detected data image into equal (1×2) parts, i.e., a left and a right part thereof. In other words, the sampling unit 340 may bisect the detected data image in a horizontal direction. Then, the sampling unit 340 may sample image pixels located at pixel positions (2, 2), (5, 2), (8, 2), . . . , (359, 2), (2, 5), (5, 5), . . . , (359, 719) at intervals of 3 image pixels in both a horizontal and a vertical direction inside of the left part of the detected data image. However, on an area crossing over a border of the partitioned detected data image, the sampling unit 340 may perform a sampling at intervals of 4 image pixels in a horizontal direction. That is, the sampling unit 340 extracts image pixels on $363^{rd}$ column in lieu of $362^{nd}$ column after sampling image pixels on 359th column. Accordingly, inside of the right part, image pixels placed at pixel positions (363, 2), (366, 2), . . . , (720, 2), (363, 5), (366, 5), . . . , (720, 719) are selected by the sampling unit 340.

Further, in case that the size of the detected data image is, e.g., 719×720 image pixels; that is, in case that the horizontal length thereof is decreased by one image pixel, the number of image pixels V and H are 0 and −1, respectively. Accordingly, the detected data image is also bisected in a horizontal direction and image pixels sampled inside of the left part of the detected data image are also identical to those of the aforementioned case. However, on an area around the border between the left part and the right part of the detected data image, the sampling unit 340 may perform a sampling at intervals of 2 image pixels in a horizontal direction. That is, the sampling unit 340 extracts image pixels on $361^{st}$ column in lieu of $362^{nd}$ column after sampling image pixels on $359^{th}$ column. As a result, inside of the right part, image pixels located at pixel positions (361, 2), (364, 2), . . . , (718, 2), (361, 5), (364, 5), . . . , (718, 719) are extracted by the sampling unit 340.

Furthermore, if the size of the detected data image is, e.g., 722×720 image pixels; that is, if the horizontal length thereof is increased by two image pixels, the number of image pixels V and H are equivalent to 0 and 2, respectively. In this case, the sampling unit 340 partitions the detected data image into equal (1×3) parts, i.e., a left, a middle and a right part thereof; that is, the sampling unit 340 trisects the detected data image in a horizontal direction. Then, the sampling unit 340 may sample image pixels placed at pixel positions (2, 2), (5, 2), (8, 2), . . . , (239, 2), (2, 5), (5, 5), . . . , (239, 719) at intervals of 3 image pixels in both a horizontal and a vertical direction inside of the left part of the detected data image. However, in case a previous sampled image pixel and a current sampled image pixel are positioned in the left part and the middle part of the detected data image, respectively, the sampling unit 340 may perform a sampling in a horizontal direction at intervals of 4 image pixels. That is, the sampling unit 340 extracts image pixels on $243^{rd}$ column in lieu of $242^{nd}$ column after sampling image pixels on 239th column. Consequently, inside of the middle part, image pixels located at pixel positions (243, 2), (246, 2), . . . , (480, 2), (243, 5), (246, 5), . . . , (480, 719) are extracted by the sampling unit 340. In a similar manner, about a right border of the partitioned detected data image, the sampling unit 340 extracts image pixels on 484th column in lieu of $483^{rd}$ column after sampling image pixels on 480th column. As a result, inside of the right part, image pixels placed at pixel positions (484, 2), (487, 2), . . . , (721, 2), (484, 5), (487, 5), . . . , (721, 719) are sampled by the sampling unit 340.

Furthermore, in case that the vertical length of the detected data image is increased or decreased, a sampling method in accordance with the preferred embodiment of the present invention functions in analogous manners to those of aforementioned cases in which the horizontal length thereof is resized.

Finally, the decoder 360 may decode each data pixel of the processed data image into two binary values, i.e., "0" and "1" by comparing a light intensity of the data pixel with a threshold value.

The preferred embodiment of the present invention is capable of classifying the sampled image pixel into two binary values more clearly than the conventional sampling method, thereby decreasing the number of errors at the decoder 360. Accordingly, there has been provided a method for correcting distortions from the detected data image.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for processing holographic data reproduced from a holographic Storage medium, comprising:
    a holographic data detector for receiving a holographic data image reproduced from the holographic storage medium and outputting a page image including a detected holographic data image, wherein the holographic data image includes M1×M2 data pixels and each data pixel of the holographic data image corresponds to P1×P2 image pixels of the detected holographic data image, M1 and M2 being positive integers and P1 and P2 being positive integers greater than 1, respectively;
    a resized pixel detector for finding a resized vertical length V and a resized horizontal length H of the detected holographic data image, V and H being integers, respectively; and
    a sampling unit for partitioning the detected holographic data image into (|V|+1)×(|H|1) partitions; and sampling M1×M2 image pixels from the detected holographic data image to thereby reproduce the M1×M2 data pixels, wherein, within a partition, image pixels are sampled at intervals of P1 image pixels in a vertical direction and P2 image pixels in a horizontal direction, and, across a boundary of two neighboring partitions, image pixels are sampled (1) at intervals of P1+1 image pixels in a vertical direction if the V is a positive integer and P1−1 image pixels in the vertical direction if the V is a negative integer, and (2) at intervals of P2+1 image pixels in a horizontal direction if the H is a positive integer and P2−1 image pixels in the horizontal direction if the H is a negative integer.

2. The apparatus of claim 1, wherein the resized pixel detector includes:

means for computing a vertical and a horizontal length of the detected holographic data image; and means for calculating the resized vertical length V and the resized horizontal by length H wherein V=(the number of image pixels in a column of the detected holographic data image)−(M1×P1) and the H=(the number of image pixels in a row of the detected holographic data image)−(M2×P2).

3. The apparatus of claim 2, wherein the page image further includes a detected brim surrounding the detected holographic data image.

4. The apparatus of claim 3, wherein the means for computing the vertical and the horizontal length of the detected holographic data image computes the vertical length by using positions of a top and a bottom side of the detected brim and the horizontal length by using positions of a left and a right side of the detected brim.

5. A method for processing holographic data reproduced from a holographic storage medium, comprising the steps of:

(a) receiving, in a detector device, a holographic data image reproduced from the holographic storage medium and outputting a page image including a detected holographic data image, wherein the holographic data image includes M1×M2 data pixels and each data pixel of the holographic data image corresponds to P1×P2 image pixels of the detected holographic data image, M1 and M2 being positive integers and P1 and P2 being positive integers greater than 1, and, in a processing device:

(b) finding a resized vertical length V and a resized horizontal length H of the detected holographic data image, V and H being integers, respectively; and (c) partitioning the detected holographic data image into (|V|+1)×(|H|+1) partitions; and sampling M1×M2 image pixels from the detected holographic data image to thereby reproduce the M1×M2 data pixels, wherein, within a partition, image pixels are sampled at intervals of P1 image pixels in a vertical direction and P2 image pixels in a horizontal direction, and, across a boundary of two neighboring partitions, image pixels are sampled (1) at intervals of P1+1 image pixels in a vertical direction if the V is a positive integer and P1−1 image pixels in the vertical direction if the V is a negative integer, and (2) at intervals of P2+1 image pixels in a horizontal direction if the H is a positive and P2−1 image pixels in the horizontal direction if the H is a negative integer.

6. The method of claim 5, wherein the step (b) includes the steps of:

(b1) computing a vertical and a horizontal length of the detected holographic data image; and (b2) calculating the resized vertical length variation V and the resized horizontal length variation H, wherein V=(the number of image pixels in a column of the detected holographic data image)−(M1×P1) and the H=(the number of image pixels in a row of the detected holographic data image)−(M2×P2).

7. The method of claim 6, wherein the page image of the step (a) further includes a detected brim surrounding the detected holographic data image.

8. The method of claim 7, wherein the step (b1) computes the vertical length by using positions of a top and a bottom side of the detected brim and the horizontal length by using positions of a left and a right side of the detected brim.

* * * * *